(12) United States Patent
Truebenbach

(10) Patent No.: US 6,507,920 B1
(45) Date of Patent: Jan. 14, 2003

(54) EXTENDING SYNCHRONOUS BUSSES BY ARBITRARY LENGTHS USING NATIVE BUS PROTOCOL

(75) Inventor: Eric L. Truebenbach, Sudbury, MA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/354,137

(22) Filed: Jul. 15, 1999

(51) Int. Cl.[7] ................................................. H02H 3/05

(52) U.S. Cl. ........................ 714/43; 710/100; 712/225

(58) Field of Search ....................... 714/43, 34; 327/51; 365/63, 194, 233; 710/100; 713/600; 712/225, 36

(56) References Cited

U.S. PATENT DOCUMENTS

| | | | | |
|---|---|---|---|---|
| 5,507,029 A | * | 4/1996 | Granato et al. ............. | 395/500 |
| 5,793,987 A | * | 8/1998 | Quackenbush et al. ..... | 710/100 |
| 5,857,083 A | | 1/1999 | Venkat ........................ | 395/309 |
| 5,893,135 A | * | 4/1999 | Hasbun et al. .............. | 711/103 |
| 5,991,844 A | * | 11/1999 | Khosrowpour .............. | 710/129 |
| 6,070,214 A | | 5/2000 | Ahern ......................... | 710/128 |

FOREIGN PATENT DOCUMENTS

| | | | | |
|---|---|---|---|---|
| JP | 0624846 A | 11/1994 | ........... | G06F/13/42 |
| US | 2187315 A | 9/1987 | ........... | G01R/31/28 |
| US | 0772134 A | 5/1997 | ........... | G06F/13/40 |

OTHER PUBLICATIONS

"PCI, CompactPCI Bus Analyzers TA200/TA300 User's Manual", Revision 4.0, Oct. 1998. Catalyst Enterprises, Inc., San Jose, CA. Downloaded Jul. 1, 1999, from Catalyst web page at www.catalyst-ent.com.

Catalyst Enterprises, Inc. Web Page, including "TA300 Desc"; "Exerciser"; "Analyzer". Catalyst Enterprises, Inc., San Jose, Downloaded Jul. 1, 1999, from www.catalyst-ent-.com.

SBS Technologies, Inc. Web Page, including "Do more with PCI slots!"; "Why Worry About PCI–PCI Bridges When Designing PCI Cards & PCI System?"; "Product Information". Downloaded Jul. 1,1999, from http://www.sbs–bit3.com.

Adex Electronics Web Page, "PCI 32 bit Bus Extenders . . . Bus Isolation, Wearout, offset, Right Angle and Regular Extenders . . . " Adex Electronics, Irvine, CA, Downloaded Jul. 1, 1999 from http://www.adexelec.com/.

(List continued on next page.)

*Primary Examiner*—Robert Beausoleil
*Assistant Examiner*—Rita A Ziemer
(74) *Attorney, Agent, or Firm*—Bruce D. Rubenstein

(57) ABSTRACT

A bus extender for extending synchronous busses of limited length provides convenient access to bus cards in ATE systems. The bus extender plugs into a synchronous bus, for example, a PCI bus, and a cable carries bus signals to a remote location, where a remote card is engaged. The bus extender supports both initiator (master) and target (slave) modes of the remote card, and communicates with the remote card in the native protocol of the bus. The bus extender operates without requiring separate control from the bus. For example, the bus extender does not require its own device driver. The bus extender includes a bus snooper circuit that monitors bus transactions with the remote card and stores configuration data. The bus snooper circuit responds locally on behalf of the remote card to bus requests that require rapid responses. The bus extender further includes a state machine that copies the stored configuration data to the remote card to reset the remote card without requiring a reset of the bus. A hold-off circuit is also included within the bus extender, which determines a hold-off interval required for return signals from the remote card to settle. The hold-off circuit receives the return signals applies them to the bus after the hold-off interval elapses.

22 Claims, 11 Drawing Sheets

OTHER PUBLICATIONS

Mobility Electronics Web Page, including "Serialized PCI Split Bridge Technology". Mobility Electronics, downloaded Dec. 7, 1999, from www.mobilityelectronics.com/tech/tech.html.

Mobility Product Marketing Technical Information, "Solving Notebook Docking and Other Architectural Problems Using A Split PCI Bridge Approach". Mobility Electronics, 1999.

* cited by examiner

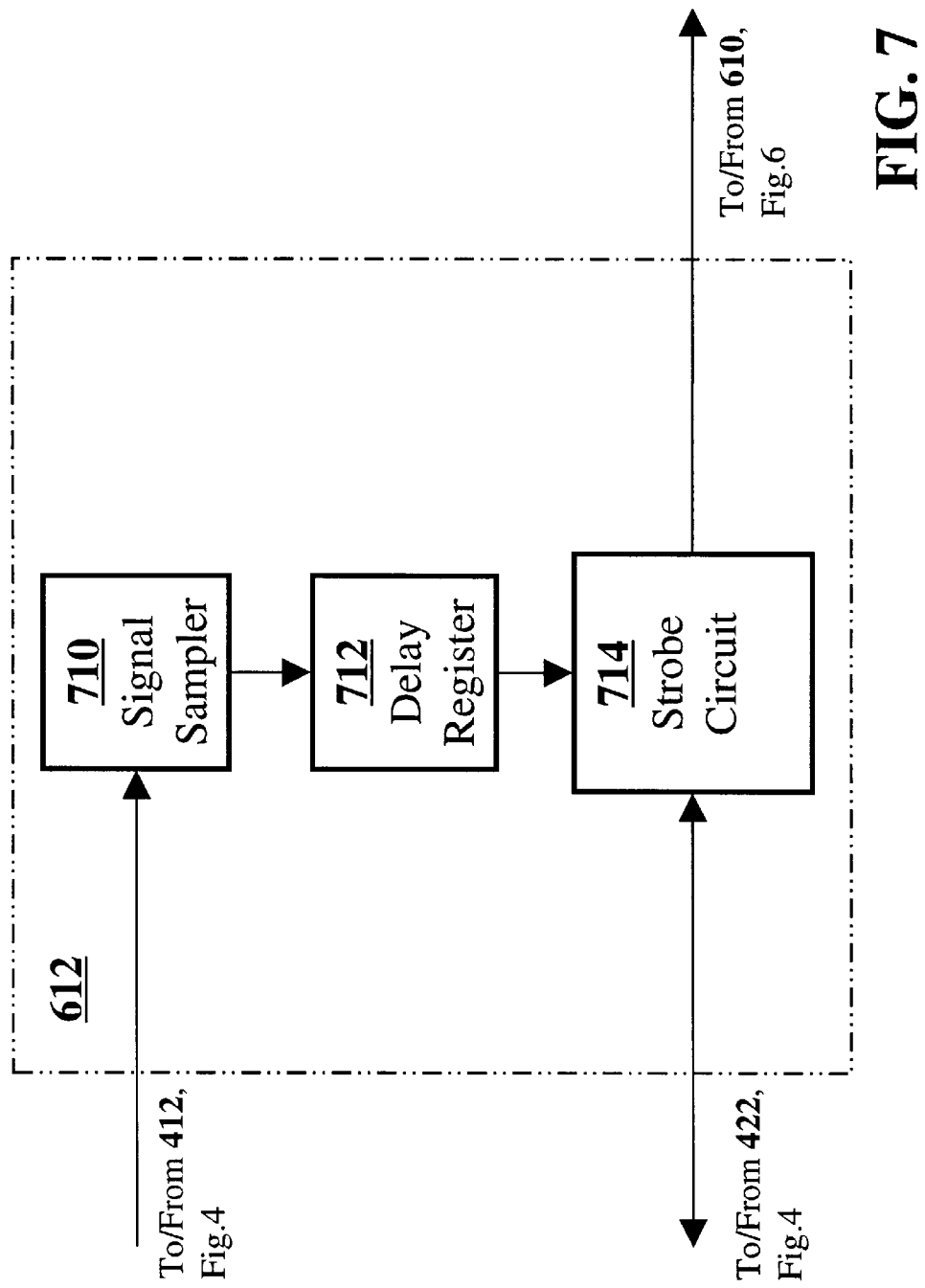

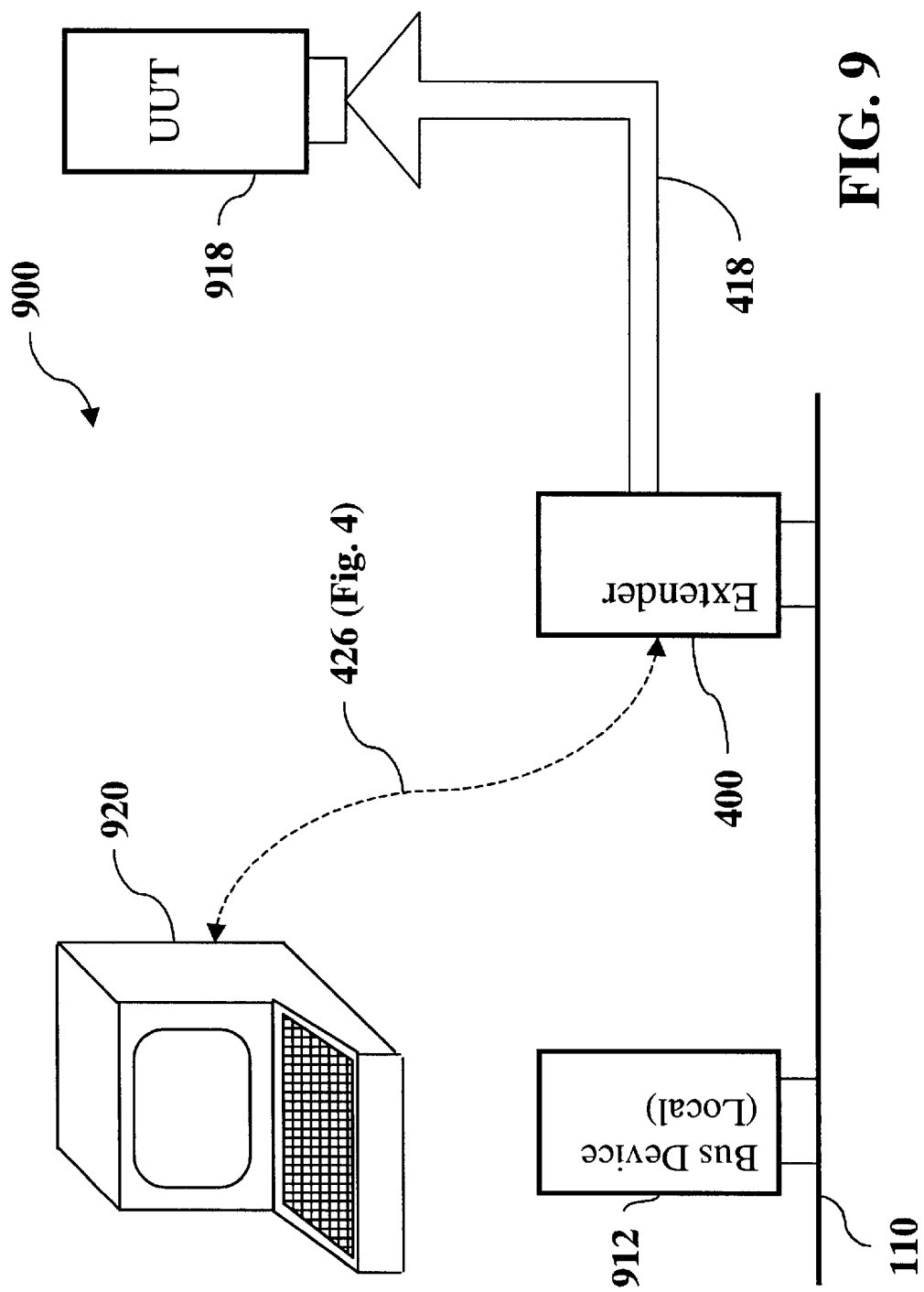

EXTENDING SYNCHRONOUS BUSSES BY ARBITRARY LENGTHS USING NATIVE BUS PROTOCOL

This invention relates generally to automatic test equipment, and more particularly to extending synchronous busses in automatic test systems that test synchronous bus devices.

BACKGROUND OF THE INVENTION

Modern computer systems employ high-speed synchronous busses for communicating data. Synchronous busses coordinate operations on a bus by providing a common clock to all bus devices. Asynchronous busses do not use a common clock to coordinate activities. Examples of synchronous busses include PCI, AGP, and Cardbus.

Manufacturers of electronic circuit boards employ automatic test equipment ("ATE" or "testers") to ensure that their products meet requirements for performance and functionality. In one testing configuration, a unit under test ("UUT") is attached to a tester via one or more interface connectors, and the tester exercises the UUT by reproducing the UUT's native environment. Where the UUT is itself a synchronous bus card, a tester might reproduce the bus environment by including a complete synchronous bus to which the UUT connects.

Certain characteristics of synchronous busses make ATE testing of synchronous bus cards problematic. A primary limitation of synchronous busses is that in order to operate at high speed they must generally be kept short. Synchronous busses that operate at 33 MHz and above are seldom more than one foot long. The need to keep synchronous busses short forces the entire bus with all of its accompanying hardware and cooling into a location near the tester interface. The area around the tester interface tends to be crowded already, however. In addition to being the focal point of most of the tester's resources, the tester interface typically also includes test adapters, auxiliary equipment, and handlers for loading and unloading UUTs. Therefore, the need to keep synchronous busses short conflicts with the lack of available space near the tester interface.

Synchronous busses also tend to suffer from poor fault isolation. Defects on one card can appear as failures on other cards, and can cause an entire bus to malfunction. A benchmark of successful ATE is the ability to isolate faults. The lack of fault isolation common to most synchronous busses directly conflicts with the need for high fault isolation in ATE.

Some synchronous busses support changing bus cards with power applied, and can identify a new card "live" without requiring an explicit reset (a feature known as "hotswapping"). Many busses are not set up to allow cards to be quickly changed, however. These busses must be powered down before a card can be inserted or removed, and a time-consuming reset must be performed before normal operation can resume. ATE systems typically test a large volume of cards in assembly-line fashion. For busses that do not support hot-swapping, the time-consuming procedure for swapping cards conflicts with the ATE requirement of high throughput.

FIG. 1 illustrates a synchronous bus of the type that is commonly used in modern computer systems, and illustrates the need for synchronous busses to be kept short. Clock driver 112 buffers a master clock signal 114 and provides an individual version of the master clock to each clock receiver 120 on each device 122, 124, and 126 plugged into the bus 110. The clock driver 112 distributes the master clock signal 114 to all slots on the bus with nearly zero timing skew: that is, nearly zero phase difference appears between the clock signals on the different slots of the bus.

As shown in FIG. 1, each device 122, 124, and 126 on the bus 110 includes a data transmitter 116, a data receiver 118, and a clock receiver 120. The bus 110 is arranged in a multi-drop, multi-master configuration, in which any device can transmit or receive data from any other device on the bus. For example, device 122 can transmit data signals using its transmitter 116 to device 126, and device 126 can then receive the data signals using its receiver 120.

FIG. 1 identifies "$T_{prop}$" as the time required for data signals to travel down the bus and settle. $T_{prop}$ is a finite delay related to a number of factors, including the bus' physical length, its impedance, the impedance of devices on the bus, inductive and capacitive loading, and bus terminations. If the period of the master clock 114 is much longer than $T_{prop}$, data signals from device 122 have adequate time to travel down the bus and settle at device 126 before the next clock edge. If $T_{prop}$ approaches or exceeds the clock period, however, device 126 receives its clock edge before the data signals settle, and invalid clocking can occur. For proper operation, $T_{prop}$ must always be less than the clock period. The practical result of the requirement that $T_{prop}$ be less than the clock period is that very fast synchronous busses tend also to be very short.

Various techniques have been used to extend the length of synchronous busses, with partial success. These techniques include changing bus loading, slowing down the bus, bridging, and remote bus control.

Changing Bus Loading

Delay time $T_{prop}$ depends not only upon a bus' physical length, but also upon its electrical loading. By reducing bus loading, it may be possible to physically extend a bus and still keep $T_{prop}$ shorter than the clock period.

As a practical matter, reducing bus loading produces only small gains. Most bus implementations aggressively control bus loading, and leave little margin for improvement. Under the best conditions, reducing bus loading allows synchronous busses to be extended only a few inches. In an ATE environment, this improvement is too small to be useful.

Slowing Down the Bus

As the clock period of a bus limits its maximum length, one can theoretically lengthen a bus by slowing its clock period. The longer the clock period, the further data can travel before false clocking occurs.

Slowing the clock period seems to be a simple and attractive way of extending a bus, but this technique has several drawbacks. First, not all busses allow their clock periods to be changed. Second, running a bus at reduced speed slows operations on the bus, and can reduce the throughput of an entire system. Third, extending a bus adds loading to the bus and can cause ringing in the clock signal, which ringing itself can cause false clocking. Reducing the clock period does not reduce the ringing. In some circumstances, however, slowing the edges of the clock does reduce ringing. Slowing clock edges is difficult to achieve in practice, however. Last, testing UUTs at reduced speed can fail to reveal certain types of defects. Many faults manifest themselves only when a UUT is operated at its rated speed. Slowing the clock sacrifices fault detection, and thus conflicts with a primary purpose of ATE.

Bridging

FIG. 2 illustrates bus bridging, a commercially available technique for extending synchronous busses. One product that appears to provide a form of bus bridging is the model 2130 available from SBS Technologies, Inc., St. Paul, Minn. As shown in FIG. 2, a bridge device 218 straddles an original synchronous bus 210 and an extended synchronous bus 212. The bridge device 218 copies signals between busses 210 and 212 and allows a remote device 216 to communicate back and forth with a local device 214. Bridging effectively connects busses in series while electrically isolating the busses from each other. Multiple bridge devices can be cascaded to extend a bus even further.

Each bus segment that forms part of a bridged configuration must conform to the specification of the bus for maximum length. Thus, bridging allows busses to be cascaded, but does not extend the length of any individual bus segment. Therefore, bridging does not address the need to keep the area around the UUT clear.

Remote Bus Control

Remote bus control has been used to extend synchronous busses by long distances. One product that appears to provide a form of remote bus control is the model TA300 from Catalyst Enterprises, Inc., San Jose, Calif. Remote bus control operates by translating bus signals into a different bus protocol, transmitting the translated signals to a remote location, and translating the signals back to their original form to reconstruct the bus signals at the remote location.

FIG. 3 illustrates an example of remote bus control. A controlling device 314 on a local synchronous bus 310 communicates with a remote device 320 on a remote synchronous bus 312. The busses communicate using a local translating device 316 that plugs into the local synchronous bus 310, a remote translating device 318 that plugs into the remote bus 312, and an interconnection 322 between the two translating devices. In certain implementations, the remote bus 312 is omitted, and the remote device 320 plugs directly into the translating device 318.

Remote bus control is almost infinitely extendable, but it suffers from many disadvantages, particularly in ATE. First, remote bus control tends to be costly because it requires a significant amount of hardware and software to accomplish its control. Second, remote bus control does not communicate with the remote card using the remote card's native environment. Remote bus control requires translation into a different protocol, for example a serial bus protocol, suitable for long-distance transmission. Remote bus control does not use the remote card's native "device driver." A "device driver" is a program that manages communication between the operating system of a host computer and a device. Remote bus control inserts a different bus protocol between the operating system and the device and does not use the native device driver to exercise the remote card. Third, remote bus control requires the use of hardware near the UUT. Even if the remote bus 312 is eliminated, the translating device 318 still is located near the UUT.

SUMMARY OF THE INVENTION

With the foregoing background in mind, it is an object of the invention to extend a synchronous bus an arbitrarily long distance using the bus' native bus protocol.

Another object of the invention is to allow hot swapping of remote bus cards, regardless of whether the bus normally supports hot swapping.

It is yet a further object to prevent faults on the remote bus card from causing faults to occur in other locations of a system, and therefore to promote fault isolation.

To achieve the foregoing objects and other objectives and advantages, a method of extending a synchronous bus uses an extender device that physically engages the synchronous bus. The method includes receiving a plurality of bus signals from the synchronous bus, driving the plurality of bus signals to a remote device via an interconnect, and receiving return signals from the remote device over the interconnect. The method further includes establishing a hold-off interval, at least as long as the settling time of the return signals, and applying the return signals to the synchronous bus after the hold-off interval elapses.

In accordance with another aspect of the invention, a method of extending a synchronous bus using an extender device that physically engages the synchronous bus includes monitoring the synchronous bus to detect a transaction with a remote device. The transaction includes contents that encode a configuration of the remote device. The method further includes storing the contents of the transaction with the remote device, to maintain a local copy of the configuration of the remote device.

In accordance with another aspect of the invention, a method of testing UUTs includes building a record of configuration data for a first UUT. The method also includes blocking a flow of power between the synchronous bus and the first UUT until a time after a second UUT is installed. The method includes copying the record of configuration data for the first UUT onto the second UUT before proceeding to test the second UUT. The method thereby allows UUTs to be exchanged safely while the synchronous bus remains operative.

In accordance with another aspect of the invention, a bus extender for extending a synchronous bus facilitates the testing of synchronous bus cards. The bus extender includes an extender device, coupled to the synchronous bus, and an interconnect, coupled to the extender device and extending over a length to a connector arranged to engage a UUT. The extender device includes a hold-off circuit, coupled to the interconnect and the synchronous bus. The hold-off circuit includes a delay register for storing a hold-off interval, based upon the length of the interconnect, and a delay circuit. The delay circuit prevents return signals that arrive from the UUT from asserting onto the synchronous bus until the hold-off interval elapses.

Additional objects, advantages and novel features of the invention will become apparent from a consideration of the ensuing description and drawings.

BRIEF DESCRIPTION OF THE DRAWINGS

The invention will be better understood by reference to the following more detailed description and accompanying drawings in which

FIG. 7 is a block diagram that details the delay determination circuit FIG. 6;

FIG. 9 is a block diagram showing a test system that includes a bus extender according to the invention for testing a remote UUT;

DESCRIPTION OF THE PREFERRED EMBODIMENT

In accordance with the invention, a bus extender extends a physically limited, synchronous bus an arbitrarily long distance, while maintaining the native protocol of the synchronous bus. The bus extender supports both "initiator" (master) and "target" (slave) operations of a remote device. The bus extender according to the invention allows the remote device to operate as if the remote device were plugged directly into the bus.

Figure 1:
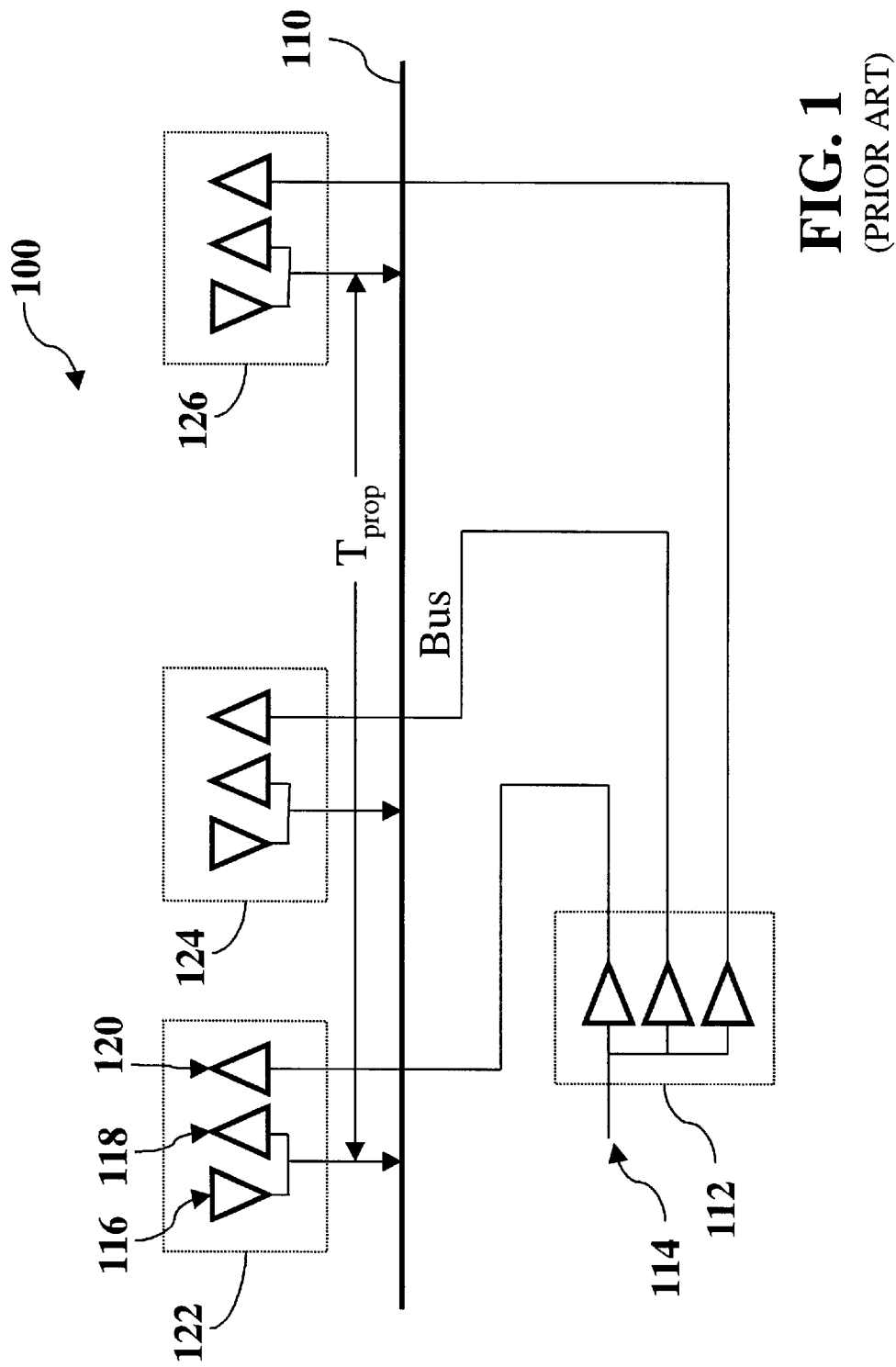
FIG. 1 is a simplified schematic of a conventional synchronous bus architecture with which the invention can operate.
Figure 2:
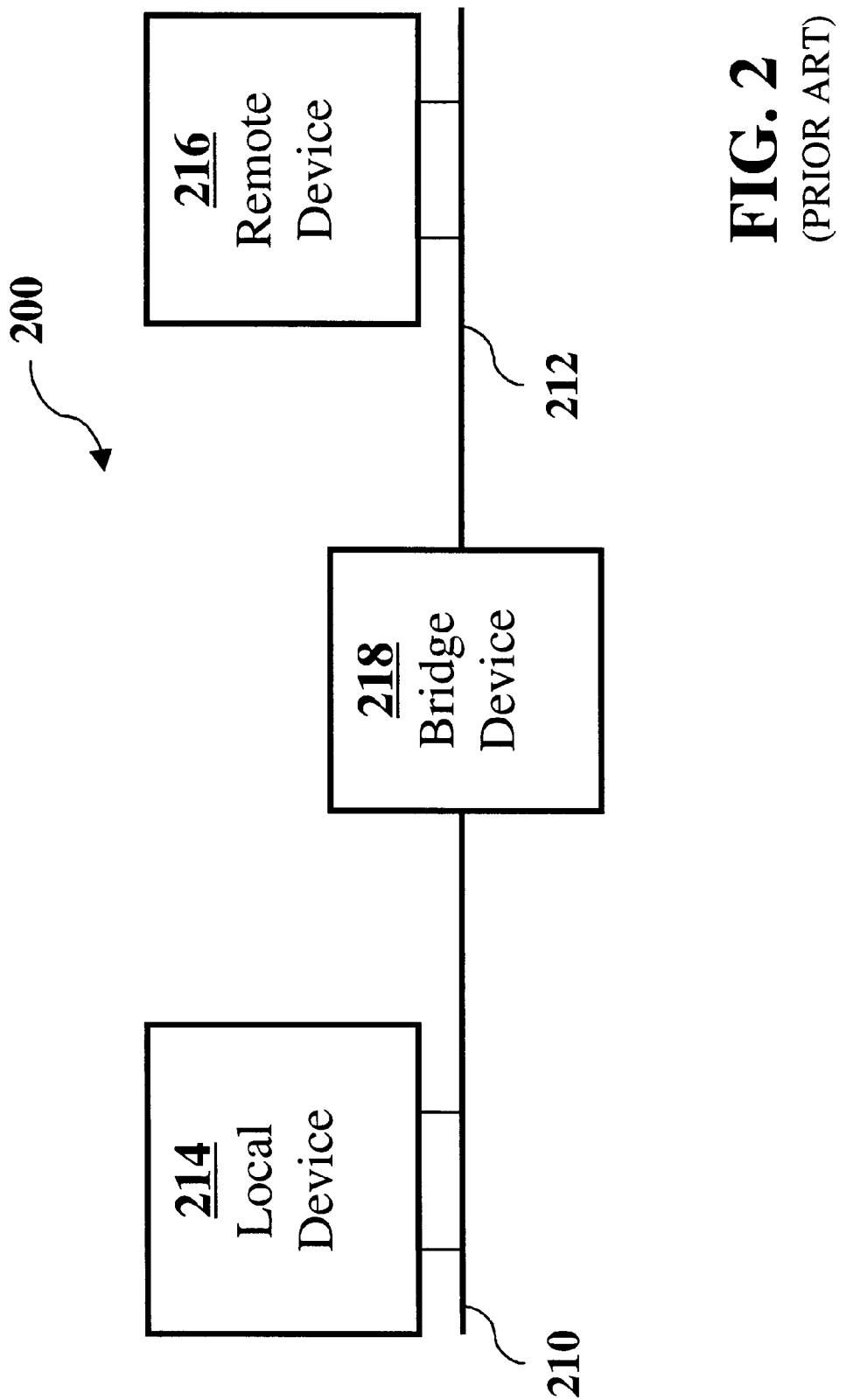
FIG. 2 is a block diagram showing the prior art technique of bridging.
Figure 3:
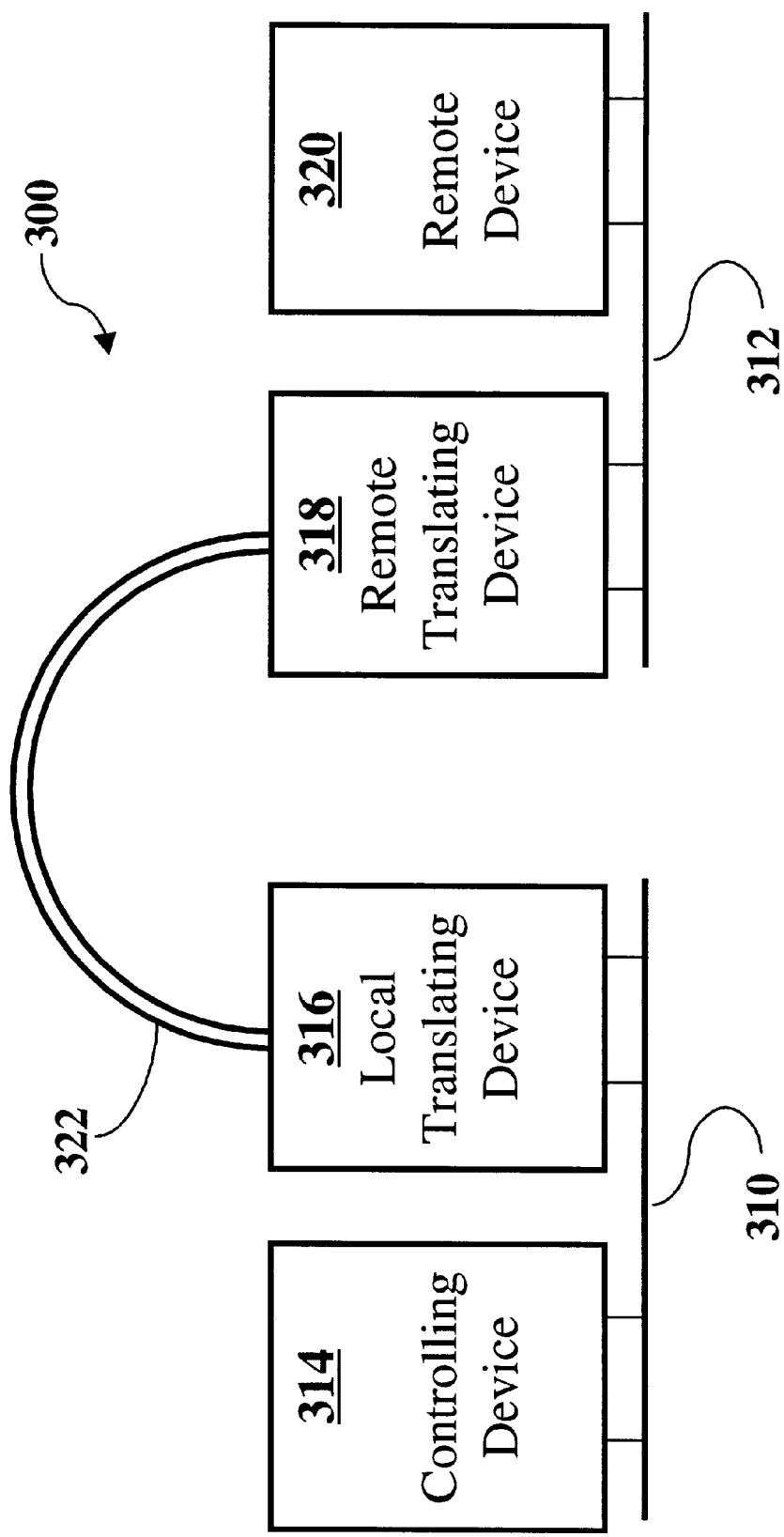
FIG. 3 is a block diagram showing the prior art technique of remote bus control.
Figure 4:
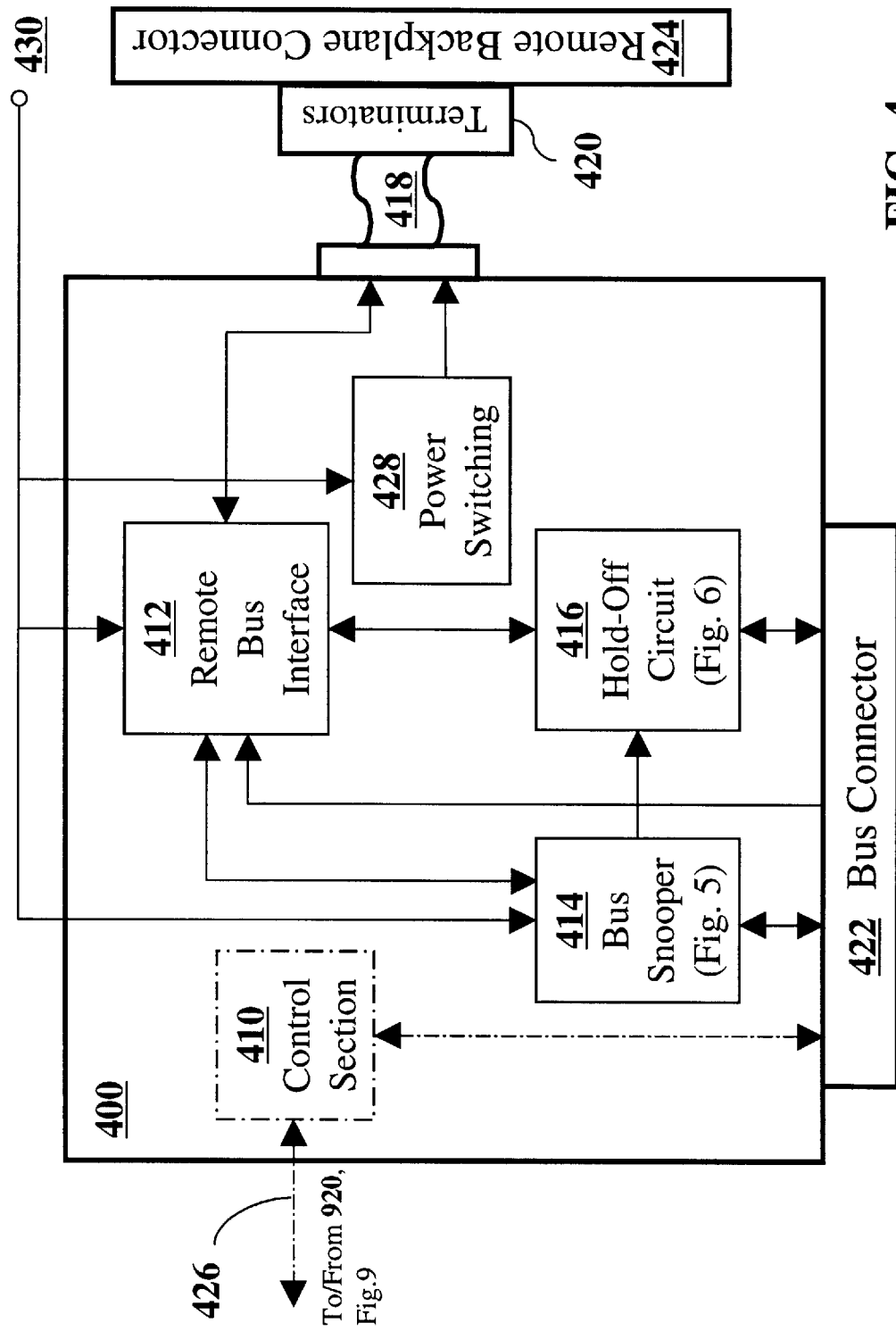
FIG. 4 is a block diagram of a bus extender, according to the invention.

FIG. 4 illustrates in block diagram form a bus extender 400 according to the invention. The bus extender engages a bus 110 (FIG. 1), for example a PCI bus, via a bus connector 422. An interconnect 418 connects to the bus extender and extends bus signals an arbitrarily long distance to a remote backplane connector 424, where a remote bus card is engaged. Bus terminators 420 terminate the bus signals near remote backplane connector 424.

Preferably, the bus extender 400 takes the form of a standard bus card. In the preferred embodiment, bus extender 400 is a single-slot PCI card, having standard PCI size and shape, and can plug into any available slot of a PCI bus. Bus connector 422 is preferably a standard PCI card connector, and remote backplane connector 424 is preferably a standard PCI backplane connector. Interconnect 418 is typically a cable, although a printed circuit board, flex card, or other multi-signal conducting medium may operate equally as well. Preferably, interconnect 418 includes equal-length signal paths, and adds relatively little timing skew between bus signals.

As shown in FIG. 4, bus extender 400 includes a bus "snooper" circuit 414, a remote bus interface 412, and a hold-off circuit 416. The bus snooper circuit 414 decodes bus transactions and performs appropriate activities. The remote bus interface 412 transmits and receives bus signals from the bus 110 and return signals from the remote device. The hold-off circuit 416 waits a predetermined hold-off interval, after which time it applies the return signals to the bus. The hold-off interval is preferably variable and is set to an interval long enough to allow the return signals to reach the bus extender and settle.

In the preferred embodiment, the remote bus interface 412, the bus snooper circuit 414, and the hold-off circuit 416 are manufactured together on a single field-programmable gate array ("FPGA") using 3.3V CMOS logic. An FPGA is used for convenience and is not essential to the invention. An application-specific integrated circuit (ASIC) may also be used, as well as discrete components or other high-density devices. The FPGA implementation supports 33 MHz, 32-bit performance and complies with PCI Version 2.2 standards. The design is extendable, however, to support 66 MHz, 64-bit PCI performance on other busses.

Optionally, a control section 410 is provided within the FPGA to communicate with an ATE controller via a control line 426. Using control line 426, the control section 410 reports faults to the ATE controller and receives operating instructions from the ATE controller. Alternatively, the control section communicates directly with the bus 110 to report faults and receive operating instructions. Preferably, however, the control section 410 is omitted, and the bus extender 400 operates in a self-contained fashion, without requiring explicit control from outside the bus extender. Preferably, the bus extender 400 does not require or use separate software. For example, the bus extender does not require its own device driver.

The remote bus interface 412 marks both the source of signals transmitted to the remote device and the receiver of return signals sent back from the remote device. In order to transmit the bus signals over a long distance to the remote device and to drive the load impedance of the bus terminators 420, the remote bus interface 412 preferably includes low impedance drivers. Each low-impedance driver preferably consists of several CMOS gates of the FPGA connected in parallel. To achieve minimum timing skew, the low impedance drivers preferably have identical circuit topology. CMOS gates are preferably provided within the FPGA to receive and buffer the return signals from the remote device. By maintaining a constant characteristic impedance of the interconnect 418 and by terminating the bus with bus terminators 420 near the remote device, the bus extender 400 can transmit and receive signals without substantial ringing or distortion.

The bus extender 400 also includes a power switching circuit 428, coupled to the remote bus interface 412. The power switching circuit selectively blocks and conducts power supply current between the extender 400 and the remote device, in response to a digital "hot-swap" signal provided at a hot-swap terminal 430, shown in FIG. 4. The hotswap signal has two discrete states, OPEN and CLOSE. During the OPEN state the power switching circuit blocks power to the remote device. During the CLOSE state the power switching circuit conducts power freely between the bus extender 400 and the remote device. The hot-swap terminal 430 may be driven from any suitable digital source, for example, a digital bit at the tester interface or a manual switch. Preferably, the lowimpedance drivers of the remote bus interface 412 also assume a high-impedance state in response to an activation of the hot-swap signal. The ability of the power switching circuit and the low-impedance drivers to assume high impedance states enables the remote device to power down or be safely swapped while the bus 110 continues to operate.

The implementation of the power switching circuit 428 includes high-current switching devices, preferably high-current MOSFETs external to the FPGA. The circuitry to drive the low-impedance drivers to high-impedance states preferably resides within the FPGA. Optionally, the power switching circuit can be equipped with power sequencing circuitry, for applying and removing power from the remote device according to a predetermined timing sequence.

Figure 5:
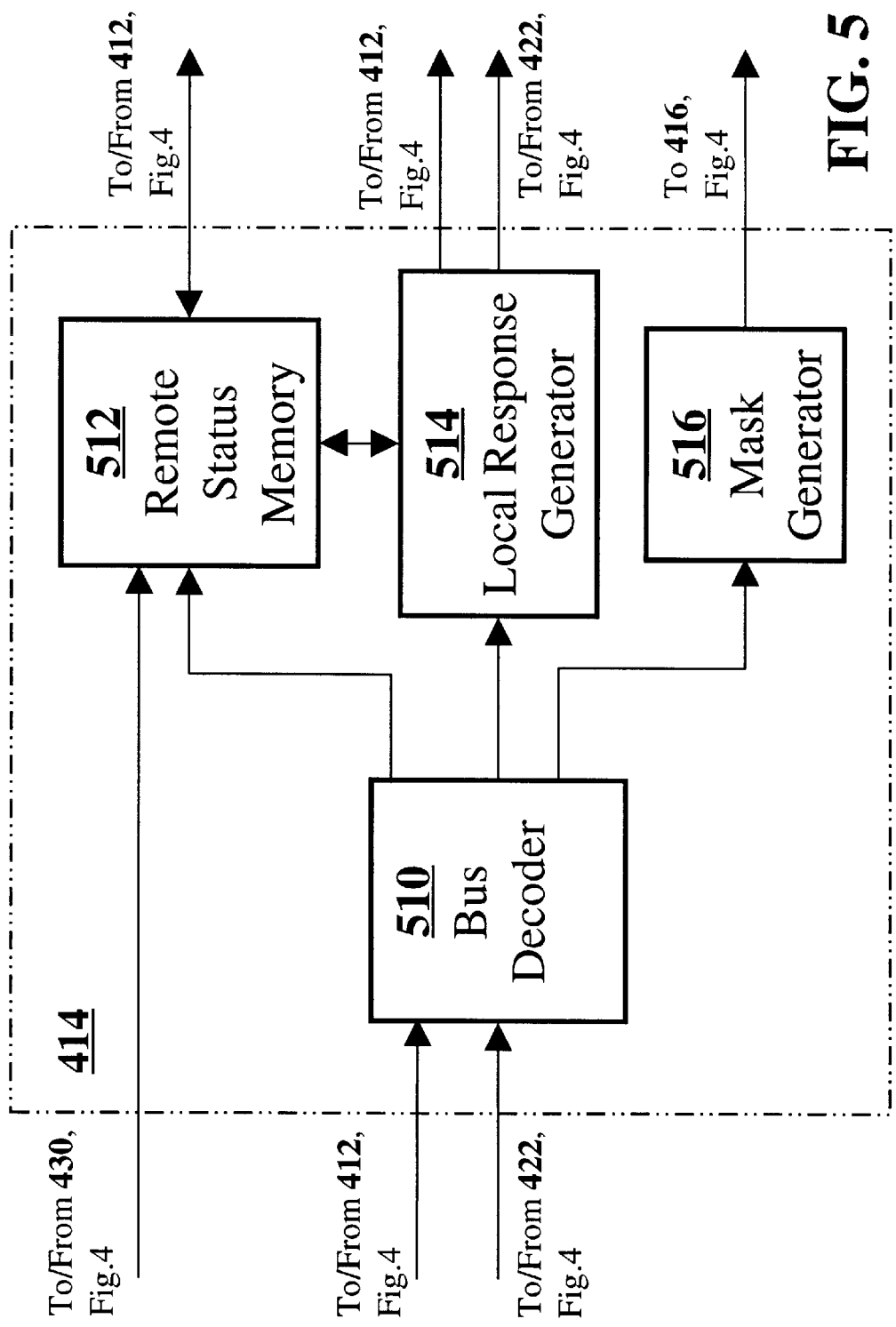
FIG. 5 is a block diagram that details the bus snooper circuit of FIG. 4.

FIG. 5 illustrates the bus snooper circuit 414 in block diagram form The bus snooper circuit decodes bus transactions and performs appropriate activities. A bus decoder 510 connects to the bus 110 and the remote bus interface 412, and examines bus transactions between the bus and the remote device. If a transaction is a configuration WRITE instruction to the remote device, the bus decoder stores the contents of the WRITE instruction in a remote status memory 512. If a transaction is a configuration READ instruction to the remote device, the bus decoder informs a mask generator 516, which builds a data mask to modify, if necessary, data to be read back from the remote device. If a transaction is one that requires a rapid response, the bus decoder informs the local response generator 514, which generates an appropriate rapid response.

The bus snooper circuit 414 stores the contents of configuration WRITE instructions directed to the remote device in the remote status memory 512. In the preferred embodiment, the bus snooper circuit 414 does not store the contents of all WRITE instructions in the remote status memory 512. Rather, it stores only the contents of target WRITE instructions directed to 64 particular "configuration" registers of the remote device. The PCI specification defines 64 configuration registers of a PCI card. Many of these registers must be written in order for the PCI bus to operate. As is known, the PCI bus BIOS writes necessary values of these 64 configuration registers for each device plugged into the bus, every time a PCI bus reset occurs.

Over time, and explicitly upon each PCI bus reset, the remote status memory 512 accumulates a local record of all 64 configuration registers for a remote device. Once acquired, the record of configuration registers can be restored to the remote device, or stored to a different remote device, to configure a known, stable state. No additional resets of the PCI bus are required.

Registers on a PCI card other than the 64 configuration registers (i.e., non configuration registers) are not essential for establishing bus operation. As desired by the user, contents of non-configuration registers can be copied to the remote device, using conventional target WRITE instructions, after the 64 configuration registers have been restored. Alternatively, memory can be added to the remote status memory 512 to store all data written to the remote device, but the memory would be provided at additional cost.

The PCI specification supports multiple logical devices on a single PCI card. In accordance with the preferred embodiment, the bus snooper circuit 414 distinguishes between different logical devices and provides enough memory to support numerous logical devices.

In the preferred embodiment, the bus extender 400 employs a state machine (not pictured) to copy the contents of the remote status memory 512 to the remote device. The state machine preferably operates in response to the hot-swap signal and operates independently of the bus 110. The state machine preferably also controls the power switching circuit 428. When the hot-swap signal is OPEN, the state machine activates the power switching circuit 428 to block power to the remote device. When the hot-swap signal changes state from OPEN to CLOSED, the state machine applies power to the remote device and disgorges the contents of the remote status memory 512 into the configuration registers of the remote device. The operation of the power switching circuit 428 in conjunction with the state machine enables hot-swapping of remote devices. As hot-swapping of remote devices operates independently of the bus 110, the invention effectively provides hot-swapping capability to busses that do not directly support hot-swapping.

As shown in FIG. 5, the bus snooper circuit 414 also includes a mask generator circuit 516. The mask generator circuit 516 operates in response to a predefined set of target READ instructions by generating a data mask. The mask generator 516 passes the data mask to the hold-off circuit 416, and the hold-off circuit 416 applies the mask to return signals read back from the remote device to modify the return signals, as required.

For target READ instructions of "non-configuration" registers, the data mask is transparent, i.e., it is arranged to pass through all data unchanged. The data mask is operable, i.e., not transparent, only for target READ instructions of certain configuration registers. Certain configuration registers store data that identifies characteristics of a remote device that are not valid when the remote device is used in an extended configuration. For example, PCI devices store configuration data that indicates a number of clock cycles that they require to respond to a particular transaction. That number of clock cycles may not be valid in an extended configuration, as the bus extender 400 may respond in a different number of clock cycles to account for extender latency. Under these circumstances, the mask generator 516 produces a data mask to be used for modifying the invalid bit or bits of the data read back from the remote device. As another example, a configuration register indicates whether a PCI card supports 66 MHz communication. The initial, FPGA implementation of the bus extender 400 does not support 66 MHz communication. In the FPGA embodiment of the invention, the mask generator 516 produces a data mask that forces a negative response, to assure that 66 MHz operation is not attempted.

The bus snooper circuit 414 shown in FIG. 5 also includes a local response generator 514. The bus decoder 510 identifies transactions that require rapid responses, and the local response generator 514 produces an appropriate rapid response. The local response generator is used because extended configurations add latency that is not accounted for in bus specifications. For example, according to the PCI bus specification, when a PCI initiator sends an address to a PCI target, the bus initiator expects the bus target to respond within a predefined time limit. The bus initiator interprets a failure to respond as meaning that no PCI device is installed in the addressed slot.

In an extended configuration, remote bus targets typically cannot respond within the allowable time. According to the invention, when the remote device operates as a bus target, the local response generator 514 issues a response to the bus initiator on behalf of the remote device, within the allowable time. The local response generator's response may include asserting one or more wait states onto the bus 110. Analogously, when the remote device operates as a bus initiator, the local response generator's response may include sending one or more wait states to the remote device on behalf of the local bus target, within the time allowed for response by the PCI specification.

When the remote device operates as a bus initiator, the local response generator 514 continually applies wait states to the remote device in anticipation of an initiator READ or WRITE instruction from the remote device. The bus extender 400 cannot wait until it receives an initiator READ or WRITE instruction from the remote device before it starts asserting wait states to the remote device, because the remote device may not receive the wait states within the time for response allowed by the PCI specification. Therefore, when the remote device operates as a bus initiator, the local response generator 514 preferably asserts wait states to the remote device by default, and only stops asserting wait states once the initiator transaction is complete.

To avoid bus hang-ups, the local response generator 514 preferably includes a watchdog timer (not pictured). If the remote device is unplugged or non-functional, the watchdog timer terminates the issuance of wait states and allows normal bus operations to resume. The time-out of the watchdog timer is preferably set to a large value to accommodate all expected, normal delays. If the bus extender receives wait states from the bus target itself, the bus extender disables the watchdog timer until the bus extender stops receiving wait states, after which time the watchdog timer begins counting.

The bus extender 400 also includes a hold-off circuit 416. The hold-off circuit receives return signals from the remote bus interface 412 and waits a predetermined interval of time before releasing the return signals to the bus 110.

Figure 6:
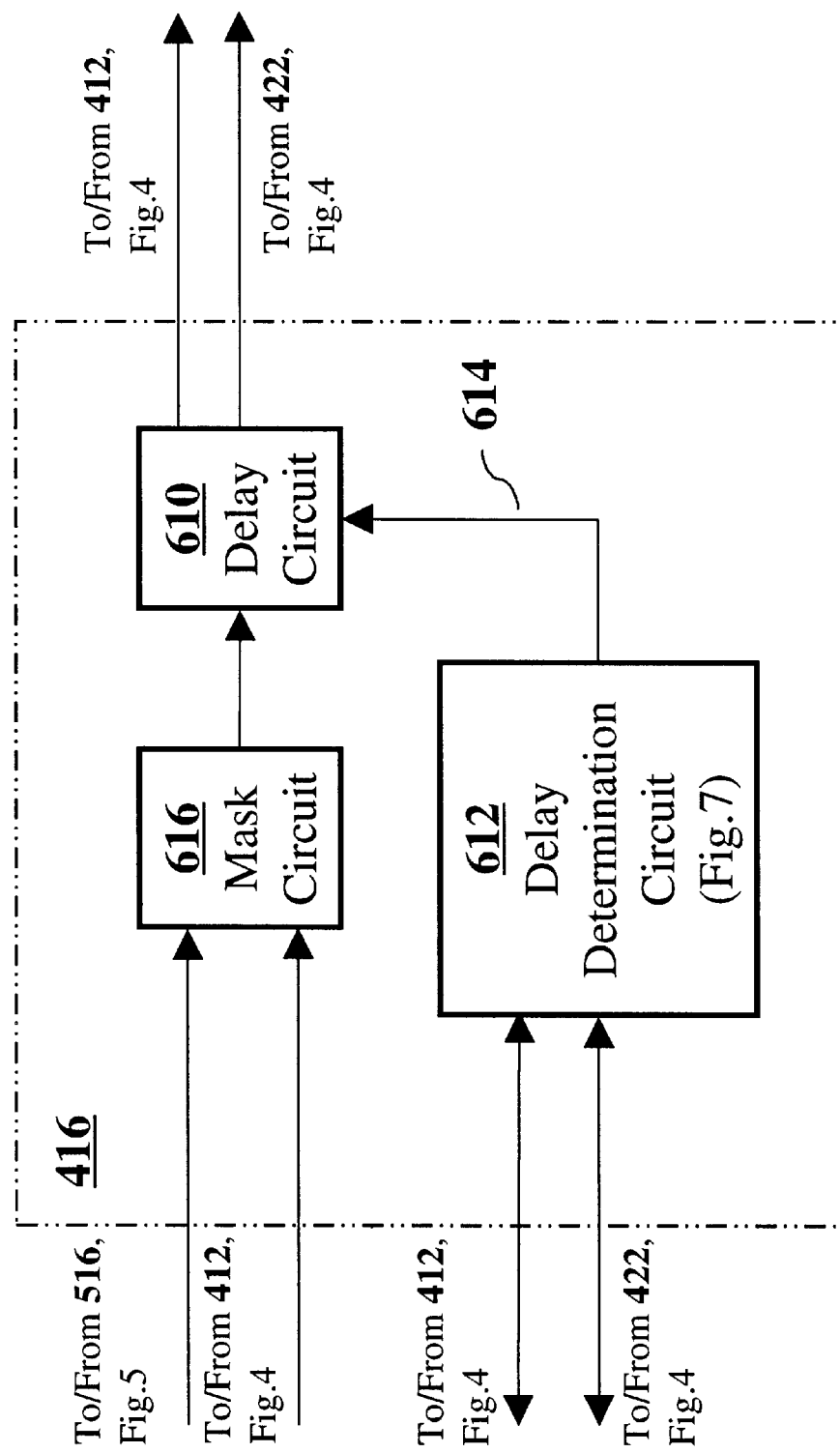
FIG. 6 is a block diagram that details the hold-off circuit of FIG. 4.

FIGS. 6 and 7 illustrate the hold-off circuit 416 in block diagram form. As shown in FIG. 6, the hold-off circuit includes a mask circuit 616, a delay circuit 610, and a delay determination circuit 612. The mask circuit 616 receives return signals from the remote bus interface 412 and applies the data mask produced by the mask generator 516 to modify the return signals, as required. The delay circuit 610 receives return signals from the mask circuit 616 and blocks their passage to the bus 110 until the delay circuit 610 receives a strobe signal 614.

As shown in FIG. 7, the delay determination circuit 612 includes a signal sampler 710, a delay register 712, and a strobe circuit 714. The signal sampler determines a hold-off interval related to the round-trip delay between the bus extender 400 and the remote device. The hold-off interval preferably includes the delay time of bus signals from the bus extender 400 to the remote device, the response time of the remote device, and the settling time of return signals returning from the remote device. The delay register 712 stores the value of the hold-off interval. When the bus extender 400 sends an instruction to the remote device, the strobe circuit 714 compares the elapsed time since the instruction is sent with the hold-off interval. When the two values match, the strobe circuit 714 activates the strobe signal 614, and the delay circuit 610 releases the return signals to the bus at the next appropriate point in the bus cycle.

The signal sampler 710 preferably determines the hold-off interval by simulating a target READ instruction to the remote device. The signal sampler measures the time interval between the issuance of the target READ instruction and the time when the return signals settle. The PCI specification designates a particular address on PCI cards for storing a manufacturer's ID and a response time to a target READ of this address. Preferably, the signal sampler simulates a target READ of the manufacturer's ID. The signal sampler 710 monitors the return signals. The return signals measure all "1"s before they arrive and settle. When the response measures something other than all "1"s, and provides identical readings for consecutive measurements, the return signals have settled. The signal sampler stores a value corresponding to the elapsed time in the delay register 712. As the remote device's response time is known (defined for a target READ of the ID register), a round-trip delay can be determined that is independent of the response time of the remote device.

According to yet another alternative, the signal sampler 710 operates in response to actual (non-simulated) target READ instructions, and generates a new hold-off interval for each instruction.

The signal sampler 710 preferably determines an optimal hold-off interval automatically upon a first use of the bus extender 400, under the direction of a state machine (not pictured). Alternatively, the signal sampler 710 operates upon the issuance of an external command. The same hold-off interval is used repeatedly for subsequent communications, until the signal sampler again receives a command to operate.

According to yet another alternative, the invention does not provide a signal sampler, and a value of the delay register 712 is established during an initial setup of the system. The value of the delay register 712 is based upon a manual measurement or an estimate of the round-trip delay between the bus extender 400 and the remote device. The value of the delay register is permanently established, or can be changed from time to time. Experiments have shown that a fixed delay of two (2) 33 Megahertz bus cycles (60 nanoseconds) is sufficient to accommodate an interconnect having a length of ten feet.

Preferably, the signal sampler 710 measures the hold-off interval by sampling the return signals at a multiple of the bus frequency, for example, at twice the bus frequency. The higher the sampling rate of the signal sampler, the greater the accuracy of the hold-off interval, and the lower the likelihood that the hold-off interval will be overstated. Alternatively, the signal sampler 710 operates at a sampling rate equal to, or slower than, the bus frequency.

We have recognized that other methods of determining when the return signals stabilize could be used by the hold-off circuit with successful results. For example, the hold-off circuit could employ a ring oscillator to set up an oscillation in a loop that includes the bus extender 400 and the interconnect 418. The frequency of oscillation is proportional to the round-trip delay. As another example, the bus extender 400 could be provided with a time-domain reflectometer (TDR) circuit for measuring a time of flight of signals between the bus extender 400 and the far end of the interconnect 418.

Figures 8A, 8B:
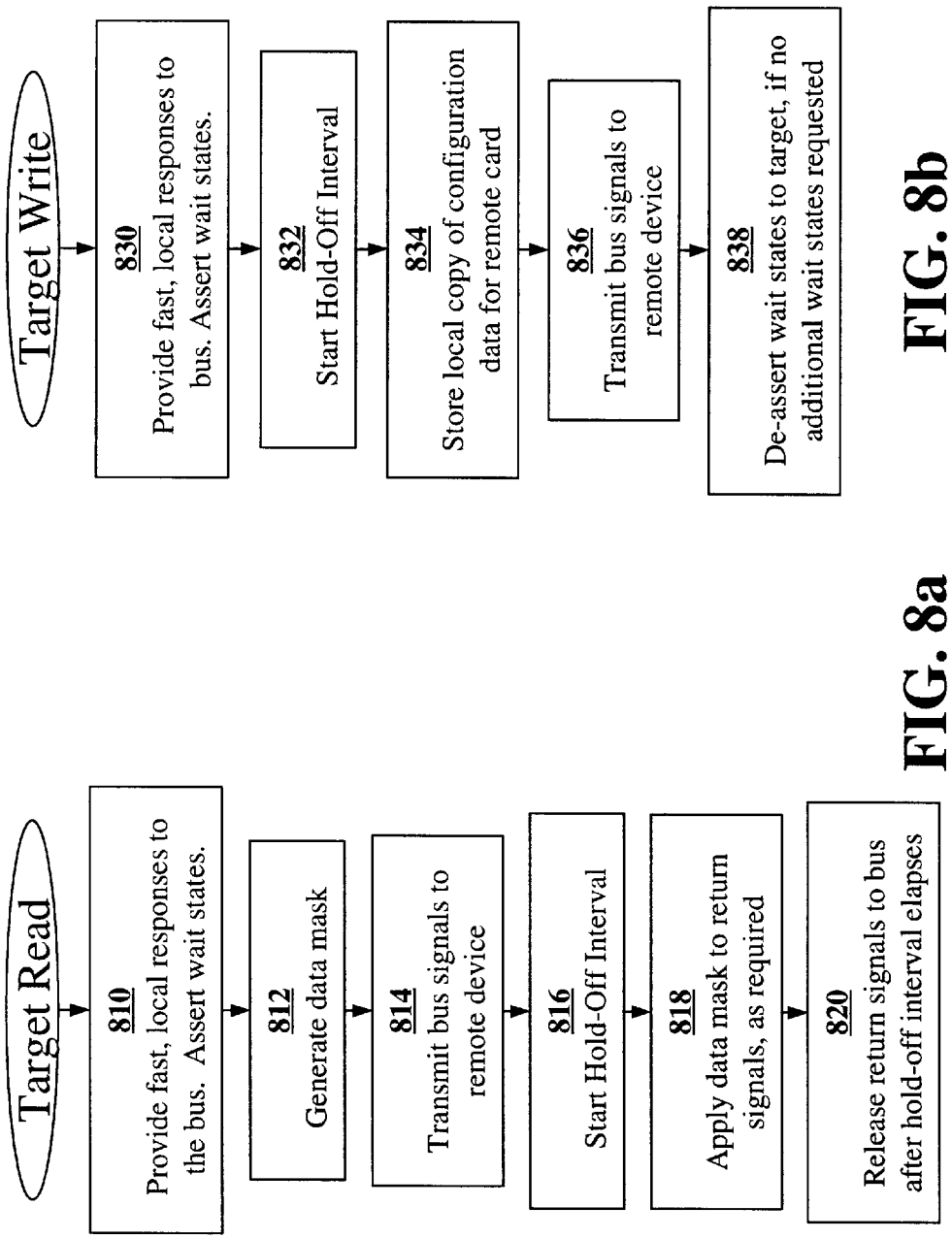
FIGS. 8a and 8b are flowcharts that respectively describe examples of reading and writing operations of a remote device using the bus extender of FIG. 4, when the remote device is operating in bus target mode.

FIGS. 8a and 8b are flowcharts that describe the activities performed by the bus extender 400, described above, when the remote device operates as a bus target (slave). FIG. 8a illustrates bus extender activities in response to a target READ instruction. FIG. 8b illustrates bus extender activities in response to a target WRITE instruction.

In FIG. 8a, the bus extender 400 receives a target READ instruction from a bus initiator on the bus 110, and the bus snooper circuit 414 decodes the target READ instruction. At step 810, the local response generator 514 generates a confirmation, on behalf of the remote bus target, that the target address specified by the bus initiator is valid. The local response generator 514 also asserts wait states onto the bus 110.

At step 812, the mask generator 516 generates a data mask. The value of the data mask is particular to the specified target address. The data mask is arranged selectively to modify bits of configuration data to be read back from the remote device, which bits encode communication characteristics that do not apply in an extended configuration. The data mask is transparent for the contents of all target READ addresses except those for configuration registers that do not apply to the extended configuration. Preferably, the mask generator 516 includes a local memory (not pictured) that stores mask values for target addresses that require a mask.

At step 814, the bus extender 400 transmits bus signals to the remote device, and at step 816, the bus extender 400 begins counting down the hold-off interval. At step 818, the return signals arrive at the bus extender 400 from the remote device, and the bus extender applies the read mask that is generated at step 812. At step 820, the hold-off interval elapses, and the bus extender 400 releases the return signals to the bus 110 at an appropriate phase into the bus cycle. The local response generator 514 de-asserts wait states from the bus 110 when the hold-off interval elapses, unless additional wait states are requested. If the remote device requests additional wait states beyond the expiration of the hold-off interval, the local response generator 514 appends the additional wait states to the bus 110.

Steps 810 through 816 are drawn in FIG. 8*a* as occurring in sequence. We have recognized, however, that the sequence of these steps can be varied. For example, the data mask generated in step 812 need not be ready until the return signals reach the bus extender 400. Preferably, steps 810 through 816 occur simultaneously.

FIG. 8*b* illustrates bus extender activities in response to a target WRITE instruction. The bus extender 400 receives a target WRITE instruction from a bus initiator on the bus 110, and the bus snooper circuit 414 decodes the target WRITE instruction. At step 830, the local response generator 514 asserts wait states onto the bus 110, within the allowable time limit for response.

At step 832, the bus extender 400 begins counting down the hold-off interval. If the target WRITE instruction is a configuration WRITE, i.e., a WRITE to one of the 64 "configuration" registers, the bus extender 400 stores a local copy of configuration data at step 834. If the remote device includes multiple logical devices, the storing step 834 includes storing configuration data for the logical device that is particularly addressed.

At step 836, the bus extender 400 transmits bus signals to the remote device. Both "configuration" and "non-configuration" WRITE instructions are transmitted. When the hold-off interval elapses, the local response generator 514 de-asserts wait states from the bus 110, unless additional wait states are requested. If the remote device requests additional wait states after the expiration of the hold-off interval, the local response generator 514 appends the requested wait states to the bus 110.

Figures 8C, 8D:
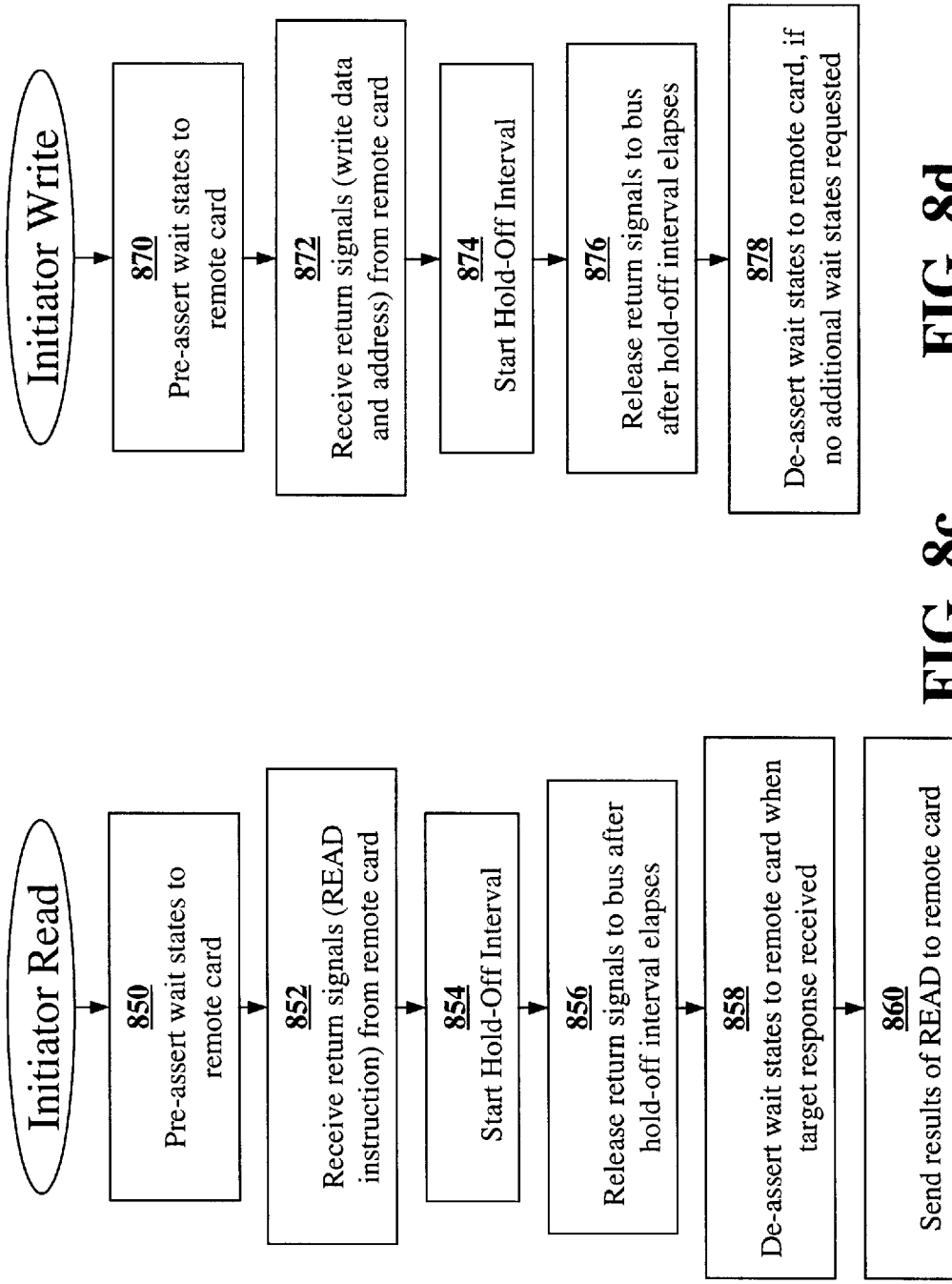
FIGS. 8c and 8d are flowcharts that respectively describe examples of reading and writing operations of a remote device using the bus extender of FIG. 4, when the remote device is operating in bus initiator mode.

FIG. 8*b* illustrates steps 830, 832, 834, and 836 in sequence; however, these steps need not occur in any particular order. Steps 830 and 832 are part of "snooping" the bus 110 and can occur in any sequence, or can occur simultaneously. Similarly, the snooping steps (832 and 834) and the step of transmitting signals to the remote device (836) can occur in any sequence, or can occur simultaneously. FIGS. 8*c* and 8*d* are flowcharts that describe the activities performed by the bus extender 400, described above, when the remote device operates as a bus initiator (master). FIG. 8*c* illustrates activities in response to an initiator READ instruction generated by the remote device. FIG. 8*d* illustrates activities in response to an initiator WRITE instruction generated by the remote device.

As shown in FIG. 8*c*, the bus extender 400 pre-asserts wait states to the remote device at step 850. Unlike the target READ case of FIG. 8*a*, in which the bus extender 400 is local to the bus initiator (i.e., the bus extender and bus initiator plug into the same bus 110), here, there is no device "local" to the bus initiator. The bus initiator is the remote device and, in general, it cannot receive a response from a bus target within the allowable time for response set by the PCI specification. Preferably, therefore, the local response generator 514 asserts wait states to the remote device continually, by default, whenever the bus extender detects that the remote card is acting as a bus initiator. The bus extender only de-asserts the wait states in response to an initiator READ once it receives an actual response from the bus target.

The bus extender 400 constantly monitors return signals to detect bus initiator activity from the remote device. At step 852, the bus extender detects a change in the return signals. To avoid errors, the bus extender waits a predetermined interval of time, sufficient for the return signals to settle, before releasing the return signals to the bus 110. In one embodiment, this interval of time is the hold-off interval described above, and the bus extender begins counting the hold-off interval at step 854. The hold-off interval includes all round-trip delays, however, and is thus longer than necessary. Alternatively, the bus extender waits a period of time shorter than the hold-off interval, but sufficiently long to allow the return signals to settle. After the predetermined interval of time elapses, the bus extender 400 releases the return signals to the bus 10 (step 856), at the next appropriate point in the bus cycle.

The return signals released at step 856 encode the initiator READ instruction from the remote device. Once asserted, the bus extender 400 waits for a response from the bus target. If the bus extender receives data (values read) from the bus target, the bus extender de-asserts wait states (step 858) and sends the results of the read instruction to the remote device (step 860). If the bus extender 400 receives one or more wait states from the bus target, the bus extender continues to assert wait states to the remote device until the bus extender stops receiving wait states from the bus target. The bus extender 400 sends the data to the remote device when the data arrives.

FIG. 8*d* illustrates bus extender activities in response to an initiator WRITE instruction from the remote device. As described above, the bus extender continually asserts wait states to the remote device whenever the bus extender detects that the remote device is acting as a bus initiator (step 870). The bus extender 400 constantly monitors return signals to detect an initiator READ or WRITE instruction from the remote device. At step 872, the bus extender detects a change in the return signals. As before, the bus extender waits a predetermined interval of time for the return signals to settle, before releasing the return signals to the bus 10. In one embodiment, this interval of time is the hold-off interval described above, and the bus extender begins counting the hold-off interval at step 874. Alternatively, the bus extender waits a period of time shorter than the hold-off interval, but sufficiently long to allow the return signals to settle. After the predetermined interval of time elapses, the bus extender 400 releases the return signals to the bus 10 (step 876), at the next appropriate point in the bus cycle. The return signals encode the initiator WRITE instruction from the remote device. If the bus target does not generate wait states in response to the WRITE instruction, the local response generator 514 de-asserts wait states to the remote device, at step 878. If the bus target does assert wait states, the local response generator 514 waits for the target to deassert wait states before it de-asserts wait states to the remote device.

FIG. 9 illustrates a test system 900 for testing a remote UUT that employs the bus extender 400 according to the invention. FIG. 10 illustrates processes for testing remote UUTs using the test system of FIG. 9. The bus extender 400 prevents faults that occur on a UUT from propagating to the bus 10, and therefore promotes fault isolation of the test system 900.

As shown in FIG. 9, the bus extender 400 plugs into the bus 10. The interconnect 418 connects to the bus extender 400 and extends to a remote UUT 918. An additional bus device 912 may also plug into the bus 110. Optionally, the test system includes an ATE controller 920 that connects to the bus extender 400 via an optional control line 426.

Figure 10C:
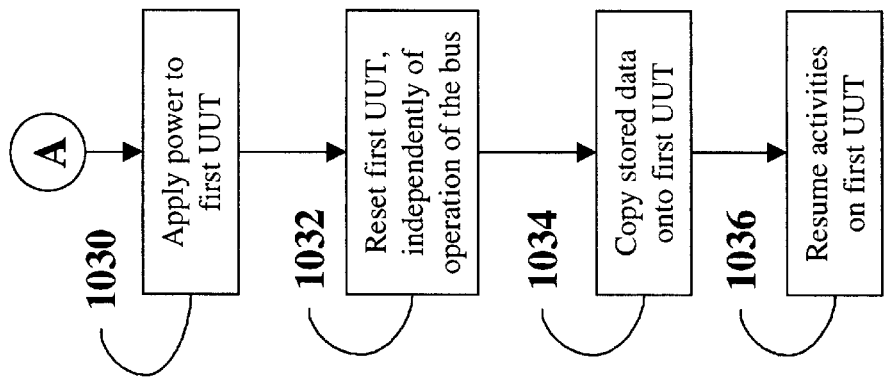
FIGS. 10a–c are flowcharts that illustrate a method of testing one or more remote UUTs in accordance with the invention.
Figure 10B:
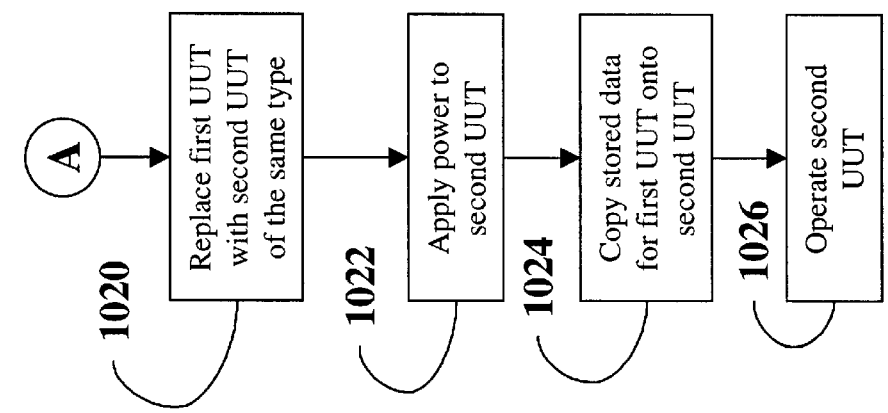
Figure 10A:
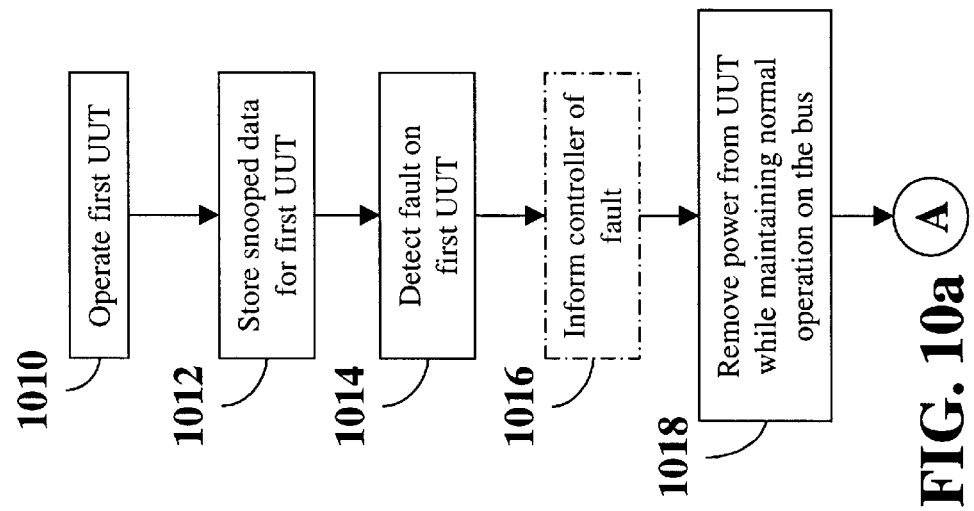

The test system 900 operates a first UUT, as shown at step 1010 of FIG. 10a. As the first UUT operates, the bus extender 400 "snoops" data written to the first UUT, and stores snooped configuration data in a local memory (step 1012). A fault may occur as the test system operates the first UUT. The bus extender 400 traps the fault and does not allow the fault to propagate to the bus 110. According to one optional embodiment, the bus extender 400 informs the ATE controller 920 of the fault via control line 426. According to another optional embodiment, the bus extender 400 informs a host computer in which the bus 110 is installed of the fault directly via the bus 110. At step 1018, power is removed from the first UUT by activating the power switching circuit 428. As described above, the power switching circuit preferably activates when the user or test program applies an OPEN level to the hot-swap terminal 430. Preferably, activation of the hot-swap signal at the hot-swap terminal 430 also configures the low-impedance drivers within the bus extender 400 to high-impedance states. Step 1018 may optionally block power to the first UUT according to a predetermined timing sequence.

At step 1020 (FIG. 10b), the first UUT 918 is replaced with a second UUT of the same type as the first UUT. A user may replace the UUT manually, or specialized handing equipment near the tester interface may replace the UUT automatically. At step 1022, the bus extender applies power to the second ULT, preferably in response to an activation of the hot-swap signal. Optionally, step 1022 applies power to the second UUT according to a predetermined timing sequence. Once power is established on the second UUT, the bus extender copies the contents of its local memory to the second UUT at step 1024. As the first and second UUTs are both of the same type, the configuration data stored in the local memory for the first UUT is valid for the second UUT. In step 1026, the test system operates the second UUT over the bus extender 400. The bus extender 400 therefore permits the first and second UUTs to be power cycled and exchanged, without the need to power cycle or reset the bus 110.

FIG. 10c illustrates how the test system 900 recovers from a fault on the first UUT. Power is restored to the first UUT at step 1030. At step 1032, the bus extender copies the configuration data stored in its local memory to the first UUT at step 1034, thereby restoring the configuration registers of the first UUT. The test system 900 resumes testing operations at step 1036. No power cycling or resetting of the bus 110 is required.

Having described one embodiment, numerous alternative embodiments or variations might be made. For example, the bus extender 400 can be built directly into a bus and need not be implemented as a bus card. The preferred embodiment is directed to the PCI bus; however, the bus extender according to the invention can be implemented on any synchronous bus, for example, Cardbus or AGP.

Numerous bus extenders may be provided on a single bus to simultaneously extend numerous bus cards to remote locations. The bus extender 400 may be used in a variety of applications. Engineers and technicians frequently need to observe bus cards in actual use. Strict limitations on bus length prohibit the use of "extender cards," that is, cards that conduct bus signals out of the plane of the bus to provide access to the front and back of a bus card. The bus extender 400 may be used in this situation to extend a bus card to a convenient debugging location, without violating bus timing requirements. The invention may also be useful in computer stores, where the invention can be used to demonstrate operations of different bus cards. The invention allows bus cards to be readily swapped, for consumer comparison, without requiring store personnel to remove the cover of a computer, power it down, and reboot the computer once a new card is in place.

It will therefore be understood by those skilled in the art that additions, deletions, and modifications can be made to the preferred embodiment described herein, without departing from the spirit and scope of the appended claims.

What is claimed is:

1. A method of extending a synchronous bus using an extender device that physically engages the synchronous bus, the method comprising the extender device:

receiving a plurality of bus signals from the synchronous bus and driving the plurality of bus signals to a remote device via an interconnect, the interconnect having an arbitrarily long length;

receiving return signals from the remote device over the interconnect, the return signals having a settling time that varies in relation to the length of the interconnect;

establishing a hold-off interval, at least as long as the settling time of the return signals; and applying the return signals to the synchronous bus after the hold-off interval elapses, thereby ensuring that the return signals settle before they are applied to the synchronous bus, regardless of the length of the interconnect.

2. The method of claim 1, wherein the step of establishing the hold-off interval comprises the extender device:

activating the remote device to generate return signals; and counting a number of sample clocks until the return signals settle.

3. The method of claim 2, wherein the step of activating the remote device to generate return signals comprises issuing a REAL) instruction to the remote device.

4. The method of claim 1, wherein the step of establishing the hold-off interval comprises setting the hold-off interval to a standard interval long enough to accommodate a range of interconnect lengths.

5. The method of claim 1, further comprising the extender device:

monitoring the synchronous bus to detect a transaction with the remote device; and storing the trans action with the remote device.

6. The method of claim 5, wherein the transaction detected in the monitoring step is a WRITE instruction to the remote device, and the step of storing the transaction includes building a record indicative of a configuration of the remote device.

7. The method of claim 6, wherein the remote device is a first remote device, and further comprising:

restoring the record indicative of the configuration of the remote device onto one of the first remote device and a second remote device, to precondition for operation said one of the first remote device and second remote device.

8. The method of claim 5, wherein the step of monitoring the synchronous bus includes detecting a condition on the synchronous bus to which a rapid response is required, and applying a rapid response to satisfy the condition on behalf of the remote device.

9. The method of claim 1, further comprising controllably applying and removing power to the remote device.

10. A method of extending a synchronous bus using an extender device that physically engages the synchronous bus, the method comprising the extender device:

monitoring the synchronous bus to detect a transaction with a remote device, the transaction including contents that encode a configuration of the remote device; and storing the contents of the transaction with the remote device, to maintain a local copy of the configuration of the remote device.

11. The method of claim 10, wherein the step of monitoring the synchronous bus further comprises:

detecting a condition on the synchronous bus to which a rapid response is required; and applying a response to satisfy the condition on behalf of the remote device.

12. The method of claim 10, wherein the remote device is a first remote device, and further comprising restoring the local copy of the configuration of the remote device onto one of the first remote device and a second remote device, to precondition for operation said one of the first remote device and second remote device.

13. A method of testing UUTs that are synchronous bus cards, comprising:

building a record of configuration data for a first UUT;

blocking a flow of power between the synchronous bus and the first UUT until a time after a second UUT is installed; and copying the record of configuration data for the first UUT onto the second UUT before proceeding to test the second UUT, thereby allowing UUTs to be exchanged safely while the synchronous bus remains operative.

14. The method of claim 13, further comprising detecting a fault on a UUT and informing an ATE controller that the fault has occurred.

15. The method of claim 14, wherein the step of informing includes communicating the fault to the ATE controller via the synchronous bus.

16. The method of claim 14, wherein the step of informing includes communicating the fault to the ATE controller via a channel that is physically distinct from the synchronous bus.

17. A bus extender for extending a synchronous bus to facilitate the testing of synchronous bus cards, comprising:

an extender device coupled to the synchronous bus; and an interconnect, coupled to the extender device and extending over a length to a connector arranged to engage a UUT, wherein the extender device includes a hold-off circuit, coupled to the interconnect and the synchronous bus, the hold-off circuit including— a delay register for storing a hold-off interval based upon the length of the interconnect; and a delay circuit for preventing return signals that arrive from the UUT from asserting onto the synchronous bus until the hold-off interval elapses.

18. The bus extender of claim 17, wherein the hold-off circuit includes a delay determination circuit, comprising:

a signal sampler, coupled to the interconnect that samples the return signals to determine a number of sample clocks required for the return signals to settle, and stores the result in the delay register; and a strobe circuit, coupled to the delay register and the delay circuit, that waits until the number of sample clocks stored in the delay register elapse, and activates the delay circuit to release the return signals to the synchronous bus.

19. The bus extender of claim 17, wherein the extender device further comprises a bus snooper circuit, the bus snooper circuit comprising:

a bus decoder, coupled to the synchronous bus that detects a transaction with the UUT; and a remote status memory, coupled to the bus decoder and the remote bus interface, that stores the transaction with the UUT.

20. The bus extender of claim 17, wherein the transaction detected by the bus decoder is a WRITE instruction to the UUT, and the remote status memory stores a record indicative of a status of the UUT.

21. The bus extender of claim 20, wherein the UUT is a first UUT, and the extender device is constructed and arranged to copy the record for the first UUT to a second UUT to precondition the second UUT for operation.

22. The bus extender of claim 19, further comprising a local response generator, coupled to the synchronous bus, that detects a condition on the synchronous bus to which a rapid response is required and applies a rapid response to satisfy the condition.

* * * * *